(12) United States Patent
Segal

(10) Patent No.: US 6,317,863 B1
(45) Date of Patent: *Nov. 13, 2001

(54) METHOD AND APPARATUS FOR IRREGULAR DATAPATH PLACEMENT IN A DATAPATH PLACEMENT TOOL

(75) Inventor: Russell B. Segal, Sunnyvale, CA (US)

(73) Assignee: Synopsys, Inc., Mountain View, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/941,893

(22) Filed: Sep. 30, 1997

(51) Int. Cl.[7] .................................................. G06F 17/50
(52) U.S. Cl. ...................................... 716/10; 716/9
(58) Field of Search ................................ 364/488, 489, 364/490, 491; 716/2, 8, 9, 10, 11, 12, 13, 14, 1

(56) References Cited

U.S. PATENT DOCUMENTS

| 5,519,627 | * | 5/1996 | Mahmood et al. | 716/18 |
| 5,838,583 | * | 11/1998 | Varadarajan et al. | 716/9 |
| 5,847,969 | * | 12/1998 | Miller et al. | 716/17 |
| 5,892,688 | * | 4/1999 | Scepanovic et al. | 716/2 |
| 5,930,499 | * | 7/1999 | Chen et al. | 716/8 |

* cited by examiner

Primary Examiner—Matthew Smith
Assistant Examiner—Vuthe Siek
(74) Attorney, Agent, or Firm—Wagner, Murabito & Hao LLP

(57) ABSTRACT

A method and apparatus for datapath placement of irregular logic, while still allowing control of wire lengths. The method and apparatus allow use of a objective, called a directed placement objective, that causes a logic gate to be placed at or near a coordinate, such as an input or output pin connected to the gate.

14 Claims, 19 Drawing Sheets

OVERVIEW OF METHOD

OVERLOW OF METHOD

350 — FORMULATE AN OBJECTIVE FUNCTION BASED ON THE CONNECTIVITY OF THE NETLIST. THE OBJECTIVE FUNCTION IS EQUAL TO THE SUM OF THE SQUARE OF THE DISTANCE BETWEEN EACH PAIR OF CONNECTED PINS IN THE NETLIST. OPTIONALLY, SOME CONNECTIONS MAY BE CONSIDERED MORE IMPORTANT BY MULTIPLYING THE SQUARE OF THE DISTANCE BY A CONSTANT GREATER THAN ONE. DO NOT INCLUDE CONNECTIONS THAT CROSS BETWEEN DATAPATH BLOCKS, AS THEY WILL BE ACCOUNTED FOR AS DESCRIBED BELOW.
CONNECTIONS THAT CROSS BETWEEN BLOCKS ARE HANDLED USING THE FOLLOWING "DIRECTED PLACEMENT" TECHNIQUE: FOR CELLS WITH CONNECTIONS THAT CROSS BETWEEN DATAPATH BLOCKS, ADD AN OBJECTIVE TO THE OBJECTIVE FUNCTION TO PLACE THE CELL NEAR THE CONNECTED DATAPATH PIN. THIS IS DONE BY ADDING TO THE OBJECTIVE FUNCTION THE SQUARE OF THE DISTANCE BETWEEN THE CELL AND THE DATAPATH PIN. OPTIONALLY, THE SQUARE MAY BE MULTIPLIED BY A CONSTANT.

352 — SPLIT THE PACEMENT REGIONS INTO TWO SUBREGIONS AND PARTITION THE CELLS OF THE NETWORK INTO TWO GROUPS, ONE FOR EACH SUBREGION. CONSTRAIN THE PLACEMENT OF THE CELLS WITHIN THE TWO GROUPS SO THAT THEIR AREA WEIGHTED MEAN (CENTER OF GRAVITY) IS AT THE CENTER OF THEIR RESPECTIVE SUBREGION.

354 — OPTIMALLY OPTIMIZE THE OBJECTIVE FUNCTION FROM STEP 350 (I.E., SOLVE THE OBJECTIVE FUNCTION) UNDER THE CONSTRAINT OF STEP 352 TO OBTAIN AN OPTIMAL CELL PARTITION. A CONJUGATE GRADIENT METHOD CAN BE USED FOR THE OPTIMIZATION.

356 — RECURSIVELY APPLY STEPS 350 THROUGH 354 ON EACH HALF OF THE PARTITIONING CIRCUIT UNTIL THE PLACEMENT REGIONS ARE VERY SMALL.

FIGURE 3(b)
EXAMPLE OF PLACEMENT TECHNIQUE INCORPORATED DIRECTED PLACEMENT (QUADRATIC PLACEMENT PLUS DIRECTED PLACEMENT)

PINS AND GATES FOR MUX

PINS AND GATES FOR MUXINV

PINS AND GATES FOR ADDER

PIN SPACING

PIN SPACING PLUS VIRTUAL WIRES

GATES AFTER DIRECTED PLACEMENT

ADDER

MAXINV

MUX

METHOD AND APPARATUS FOR IRREGULAR DATAPATH PLACEMENT IN A DATAPATH PLACEMENT TOOL

FIELD OF THE INVENTION

This application relates to a method and apparatus for combining the capabilities of synthesis tools with datapath placement tools and, particularly, to a method and apparatus for placing regular and irregular logic and for using a directed placement objective when placing logic gates in a circuit.

BACKGROUND OF THE INVENTION

Circuit designers often use software tools to aid their design process. The designer specifies the circuit to be designed using a high definition language (HDL) language (such as HDL or Verilog). The HLD is translated into a circuit design via synthesis software, such as Design Compiler, available from Synopsys, Inc. of Mountain View, Calif. The logic gates of the circuit design are then assigned a physical placement on an integrated circuit ("chip") using datapath placement software.

Conventional datapath placement software requires that the logic gates in the datapath be "regular," i.e., that each function in the datapath should operate on a collection of data inputs that contain multiple bits that are nearly identical. Thus, conventional datapath placement tools are constrained to use logic gates that are substantially the same for each bit. This regularity makes it easy to assign each logic gate to a position in the layout.

Unfortunately, state-of-the art synthesis software do not usually produce "regular" circuits. Conventional synthesis tools usually ignore the bit-by-bit regularity of datapath elements in order to obtain gains in optimization. A particular bit may be optimized very differently than its neighbors. Moreover, the function of neighboring bits may be merged together, making it difficult to assert with which bit a particular gate is associated.

Because logic gates produced by circuit synthesis tools are not regular, conventional datapath placement tools cannot be used on the output of circuit synthesis tools. Use of other conventional (non-datapath) placement tools carries inherent disadvantages. First, wiring that results from these other conventional placement tools may be longer than necessary on the average. Second, wiring that results from use of other conventional placement tools is much less predictable and controllable. Third, gate connections that result from use of other conventional placement tools are not easily combined with gate connections from standard datapath placement techniques.

What is needed is a tool to create a placement for non-regular configurations of logic gates (such as those created by circuit synthesis tools) that still maintains good wiring and integration with datapath placement.

Moreover, current placement current placement techniques are driven by one or more constraints. These constraints include 1) attempting to shorten wire lengths that connect logic gates together, 2) attempting to decrease congestion of connecting wires so that wires are not forced to run on top of one another, and 3) attempting to leave space between logic gates, where appropriate, to allow space for wires to run.

Some conventional placement tools have manual constraints whereby a user may tell the tool to place particular logic gates in a particular region of a chip. Other conventional placement tools force a logic gate to occupy an absolute position on a chip. Both types of constraints ("forced constraints") are absolutely binding as to the final position of logic gates. Forced constraints have the potential to cause the placement to be unfeasible or of inferior quality.

SUMMARY OF THE INVENTION

The present invention overcomes the problems and disadvantages of the prior art by implementing a placement tool that uses an irregular datapath placement process and that uses datapath floorplan and "directed placement" constraints. Note that the present invention does not preserve or reextract the regularity of logic gates in the circuit.

In accordance with the purpose of the invention, as embodied and broadly described herein, the invention relates to a method for datapath place of circuit elements, where a representation of a circuit to be placed is stored in a memory of a computer system, the method comprising the steps of: ordering each of a plurality of function blocks of the circuit so that the bus connections between the function blocks are optimized; obtaining an approximate area for each of the plurality of function block in the circuit; creating a rough floorplan of the entire datapath in accordance with the order of the function blocks and the area of each function block; spacing the input and output pins in each function block; and placing irregular logic gates for each function block, where a logic gate connected to an input or output pin is placed as closely as possible to that input or output pin.

In further accordance with the purpose of the invention, as embodied and broadly described herein, the invention relates to a method for datapath place of circuit elements, where a representation of a circuit to be placed is stored in a memory of a computer system, the method comprising the steps of: placing, when the function block is irregular, at least one logic gate for each function block, in accordance with a directive to place a gate near, but not necessarily at, a coordinate; and recursively repeating the placing step until a predetermined criteria is met.

Advantages of the invention will be set forth in part in the description which follows and in part will be obvious from the description or may be learned by practice of the invention. The objects and advantages of the invention will be realized and attained by using the elements and combinations particularly pointed out in the appended claims and equivalents.

BRIEF DESCRIPTION OF THE DRAWINGS

The accompanying drawings, which are incorporated in and constitute a part of this specification, illustrate several embodiments of the invention and, together with the description, serve to explain the principles of the invention.

FIG. 3(b) is a flow chart representing example substeps of the layout process of FIG. 3(a).

DESCRIPTION OF PREFERRED EMBODIMENTS

Reference will now be made in detail to preferred embodiments of the invention, examples of which are illustrated in the accompanying drawings. Wherever convenient, the same reference numbers will be used throughout the drawings to refer to the same or like parts.

I. Placement of Irregular Logic Gates

The described embodiment of the present invention creates a new placement process that places a non-regular arrangement of logic gates while still providing the important aspects that conventional placement techniques provide for regular circuits. Note that the regularity of logic gates need not be preserved or re-extracted, as is necessary for conventional datapath techniques. The described embodiment of the present invention uses two primary process inputs. Both of these inputs must be preserved while passing through the synthesis process:

1) It is necessary to preserve some level of division between datapath functions. For instance, the logic gates of two adder units should not be mixed with each other during synthesis. Some limited amount of mixing between datapath elements may be desirable to improve synthesis results, but once two functions are mixed, they must be treated as a unit by the placement process.

2) It is necessary to preserve the buses (multi-bit nets) that go into and out of the functions. In particular, the ordering (numbering) of the nets is important.

A preferred embodiment of the preferred invention uses a "directed placement" technique to perform physical layout for the gates of a circuit. In directed placement, pins are laid out to have approximately even spacing and blocks relating to the pins are constrained to be "near" a location on the chips, such as their respective pins for datapaths passing in and out of the block. Directed placement differs from absolute placing and forced constraints, because directed placement does not require that the blocks be located at any particular location, but instead specifies the blocks spatial relation to relevant locations and/or pins. Directed placement can be implemented, for example, using a quadratic placement technique modified to incorporate directed placement, as described in Section II below.

Figure 1:
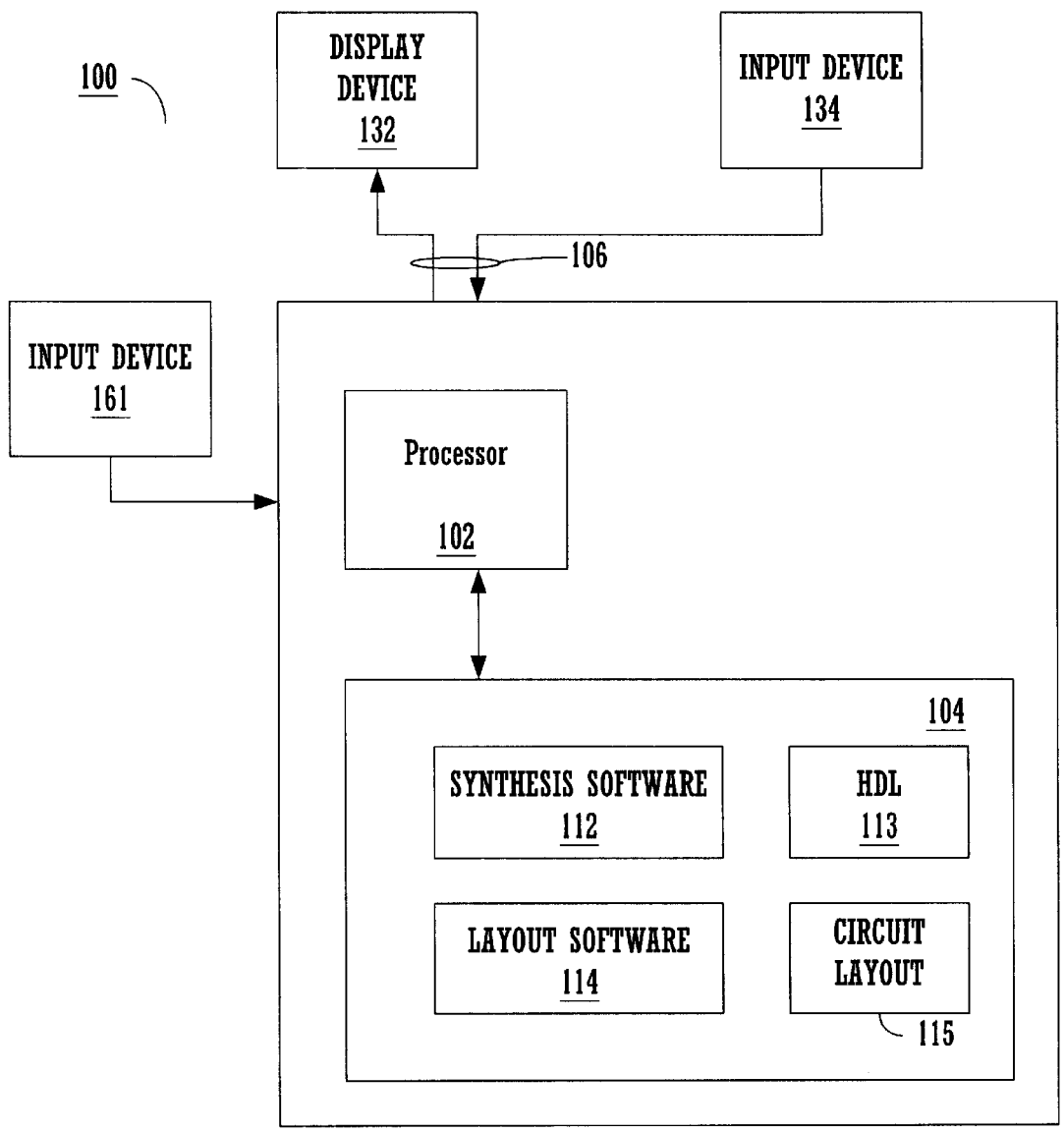
FIG. 1 is a-block diagram of an exemplary computer system used in accordance with a preferred embodiment of the present invention.

FIG. 1 is a block diagram of an exemplary computer system used in accordance with a preferred embodiment of the present invention. The steps of a method in accordance with the present invention are performed by a data processing system. In FIG. 1, computer system 100 includes a processor 102; a memory 104; input/output lines 106; an input device 134, such as a keyboard, a mouse, or a voice input device; and a display device 132, such as a display terminal. Memory 104 includes synthesis software 112, such as Design Compiler, manufactured by Synopsys, Inc., and layout software 114, which receives a netlist from, e.g., synthesis software 112 and determines a physical layout of the gates in the circuit. Memory 104 also includes a High-level Definition Language (HDL) description 113 of a circuit and a circuit layout 115 (which is output from layout software 114).

Computer system 100 also includes an input device 161, such as a floppy disk drive, CD ROM reader, or DVD reader, that reads computer instructions stored on computer readable medium 162, such as a floppy disk, a CD ROM, or a DVD drive. These computer instructions are the instructions of, e.g., layout software 114.

A person of ordinary skill in the art will understand that memory 104 also contains additional information, such as application programs, operating systems, data, etc., which are not shown in the figure for the sake of clarity. It also will be understood that computer system 100 can also include numerous elements not shown, such as disk drives, keyboards, display devices, network connections, additional memory, additional CPUs, LANs, input/output lines, etc.

In the following discussion, it will be understood that the steps of methods and flow charts discussed preferably are performed by processor 102 (or similar processors) executing instructions stored in memory, such as instructions of layout software 114. It will also be understood that, the invention is not limited to any particular implementation or programming technique and that the invention may be implemented using any appropriate techniques for implementing the functionality described herein. The described embodiment is written in the C++ programming language, but the invention is not limited to any particular programming language or operating system.

Figure 2:
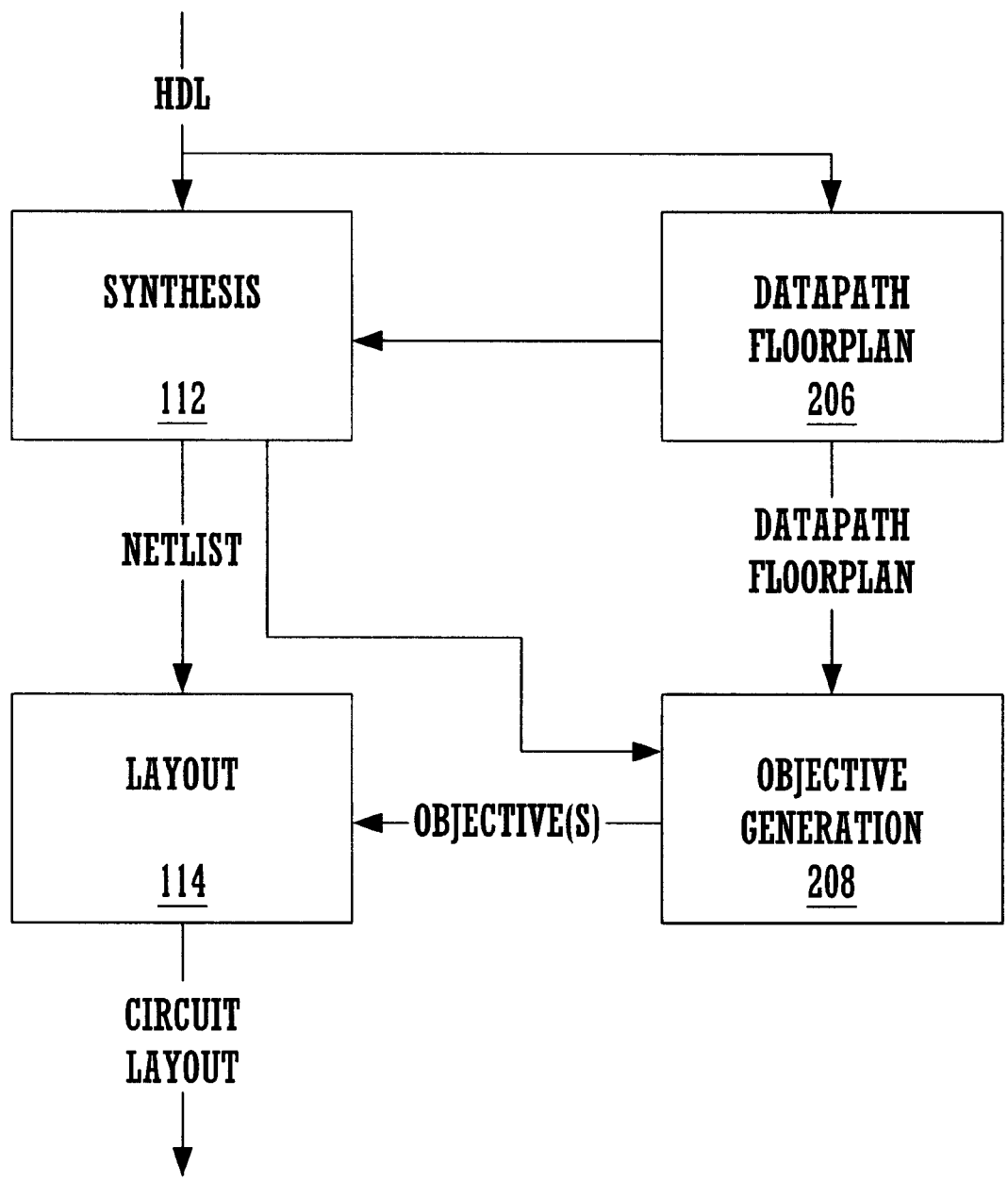
FIG. 2 shows a block diagram representing a relationship between a synthesis process, a datapath floorplanning process, and a layout process.

FIG. 2 shows a block diagram representing a relationship between a synthesis process, a datapath floorplanning process, and a layout process. An HDL description of the circuit is input to synthesis software 112, which outputs a netlist to layout software 114. Layout software 114 generates a layout for the gates in the circuit in a manner described in FIG. 3. Objective generator 208 generates objectives for the directed placement process. Generator 208 may also be incorporated into layout software 114.

Figure 3A:
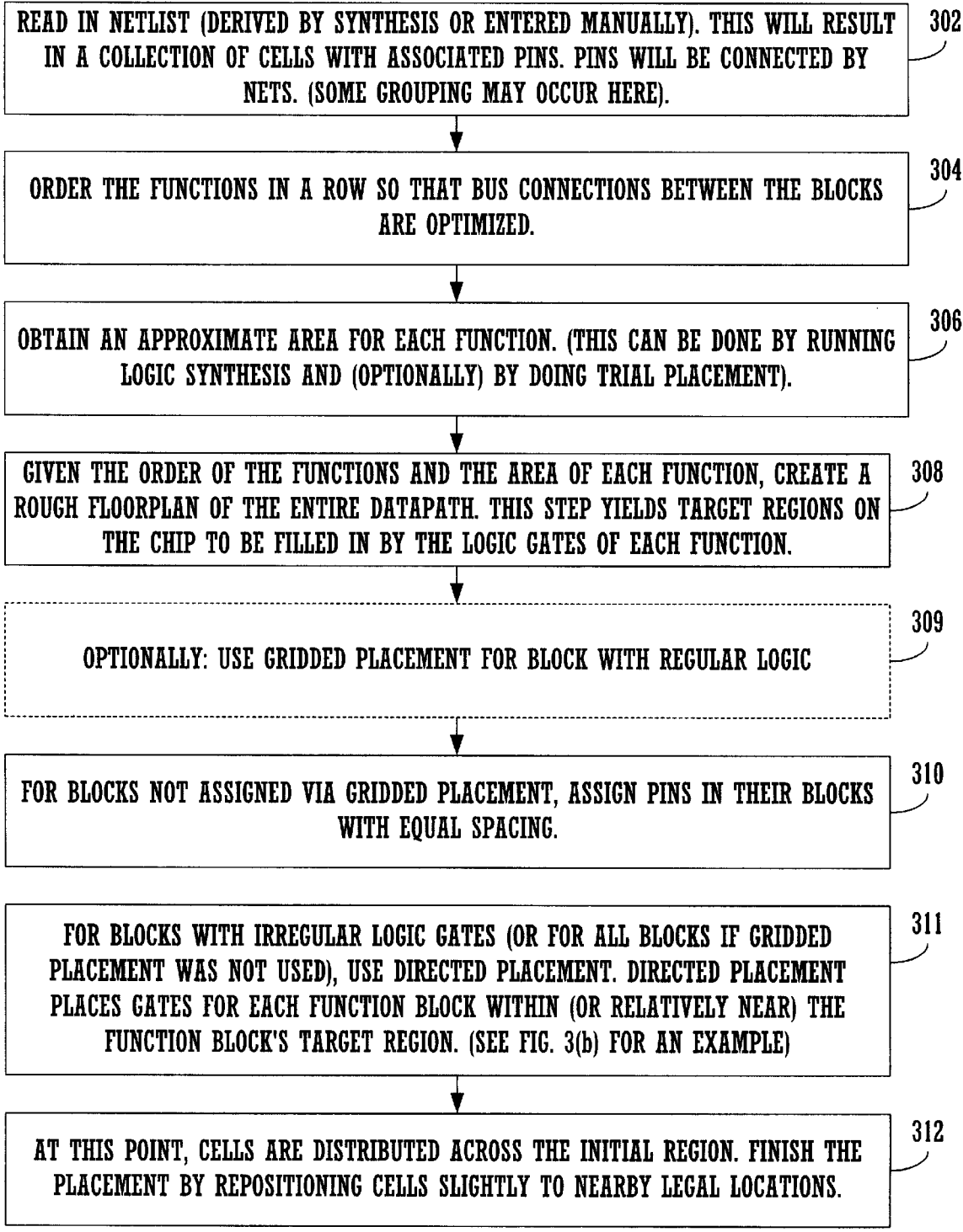
FIG. 3(a) is a flow chart representing a layout process in accordance with the present invention.

FIGS. 3(a) and 3(b) are flow charts representing a layout method performed by layout software 114 in accordance with a preferred embodiment of the present invention. The method of FIG. 3 is described below in conjunction with the example of FIGS. 4–11.

Figure 4:
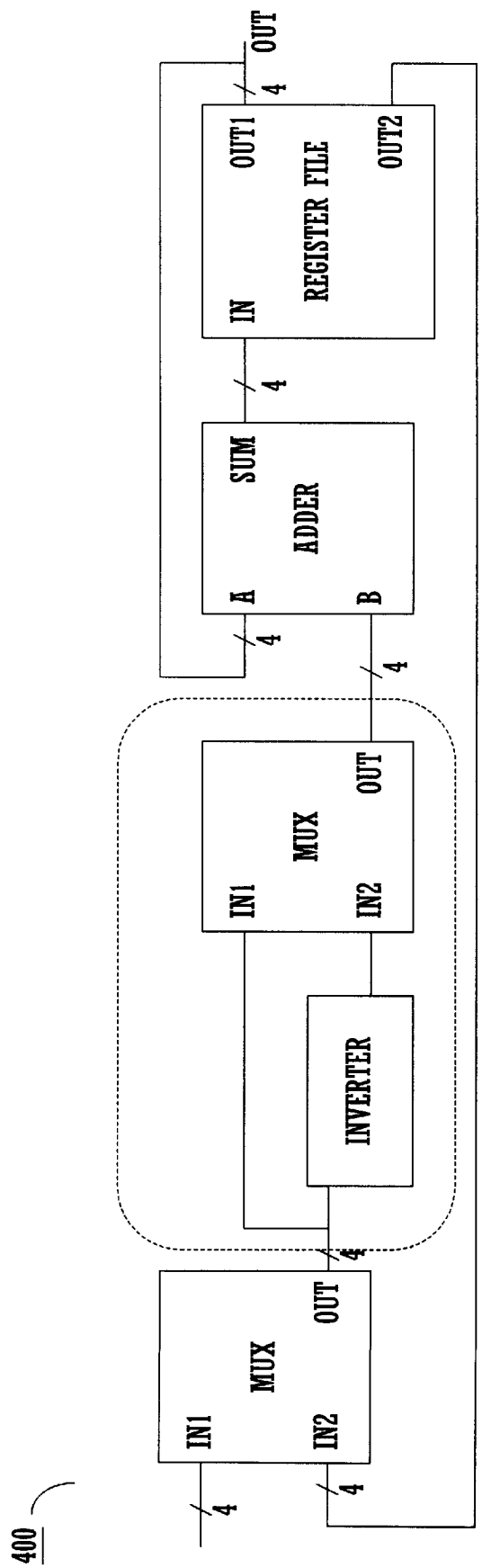
FIG. 4 shows a block diagram of an example circuit to be laid out.
Figure 5A:
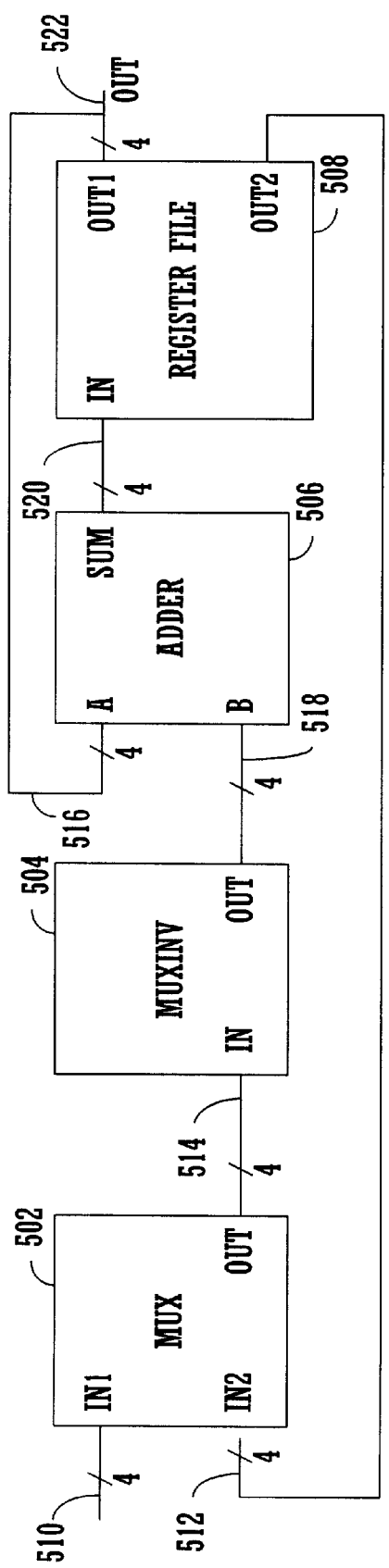
FIG. 5(a) shows the example circuit after it has been grouped.
Figure 5B:
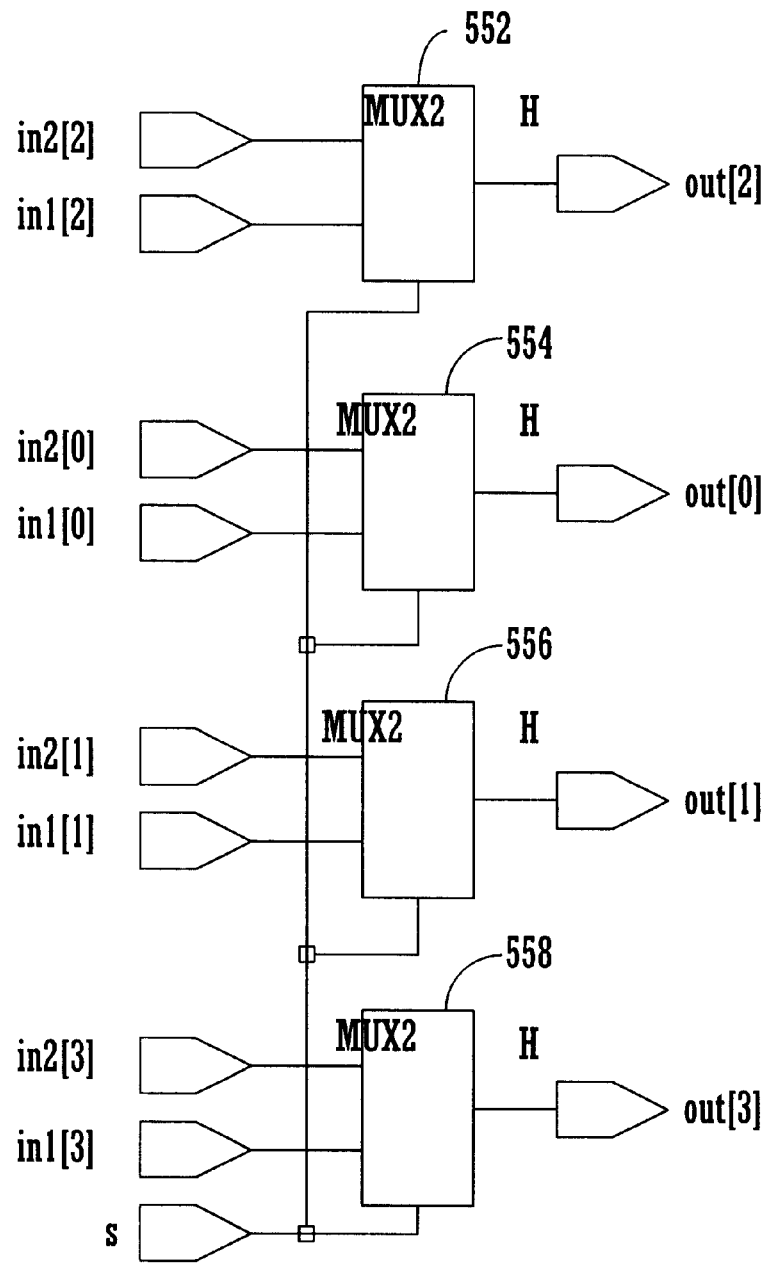
FIG. 5(b) shows a gate level view of a MUX portion of the example circuit after synthesis.
Figure 5C:
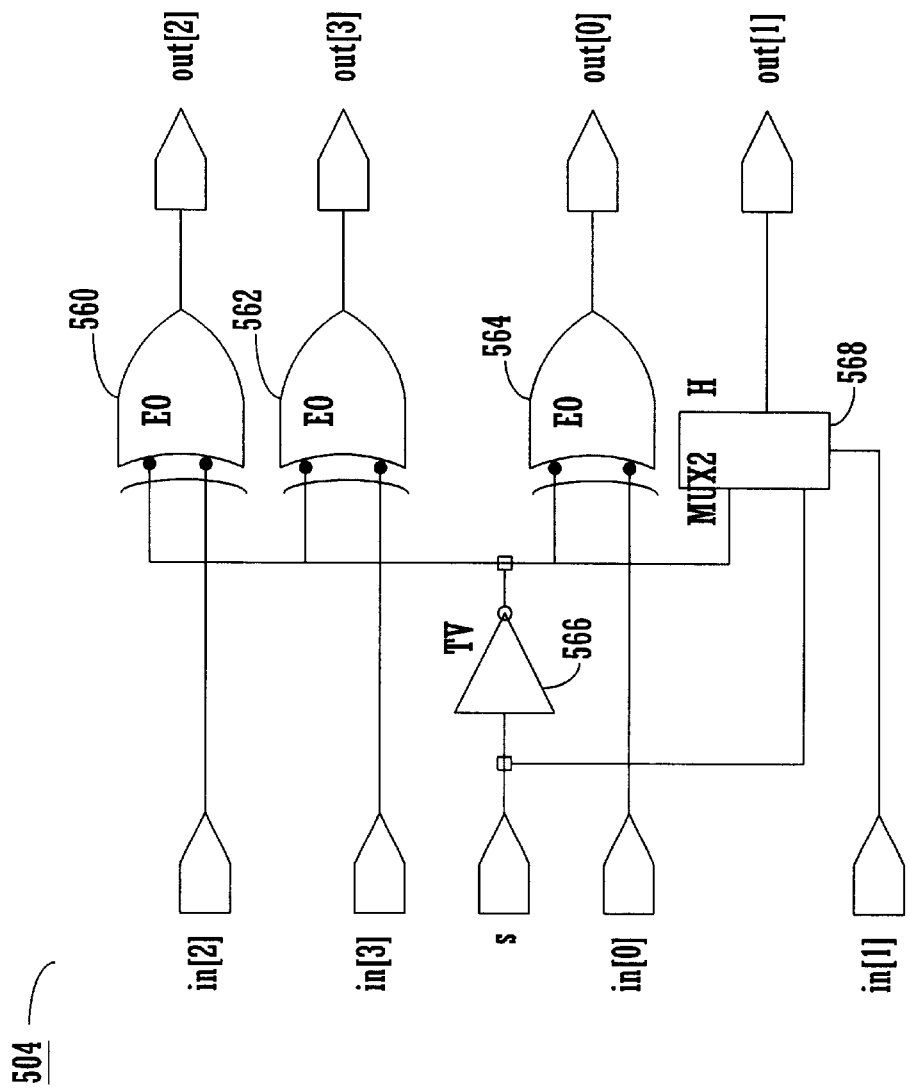
FIG. 5(c) shows a gate level view of a Muxinv portion of the example circuit after synthesis.
Figure 5D:
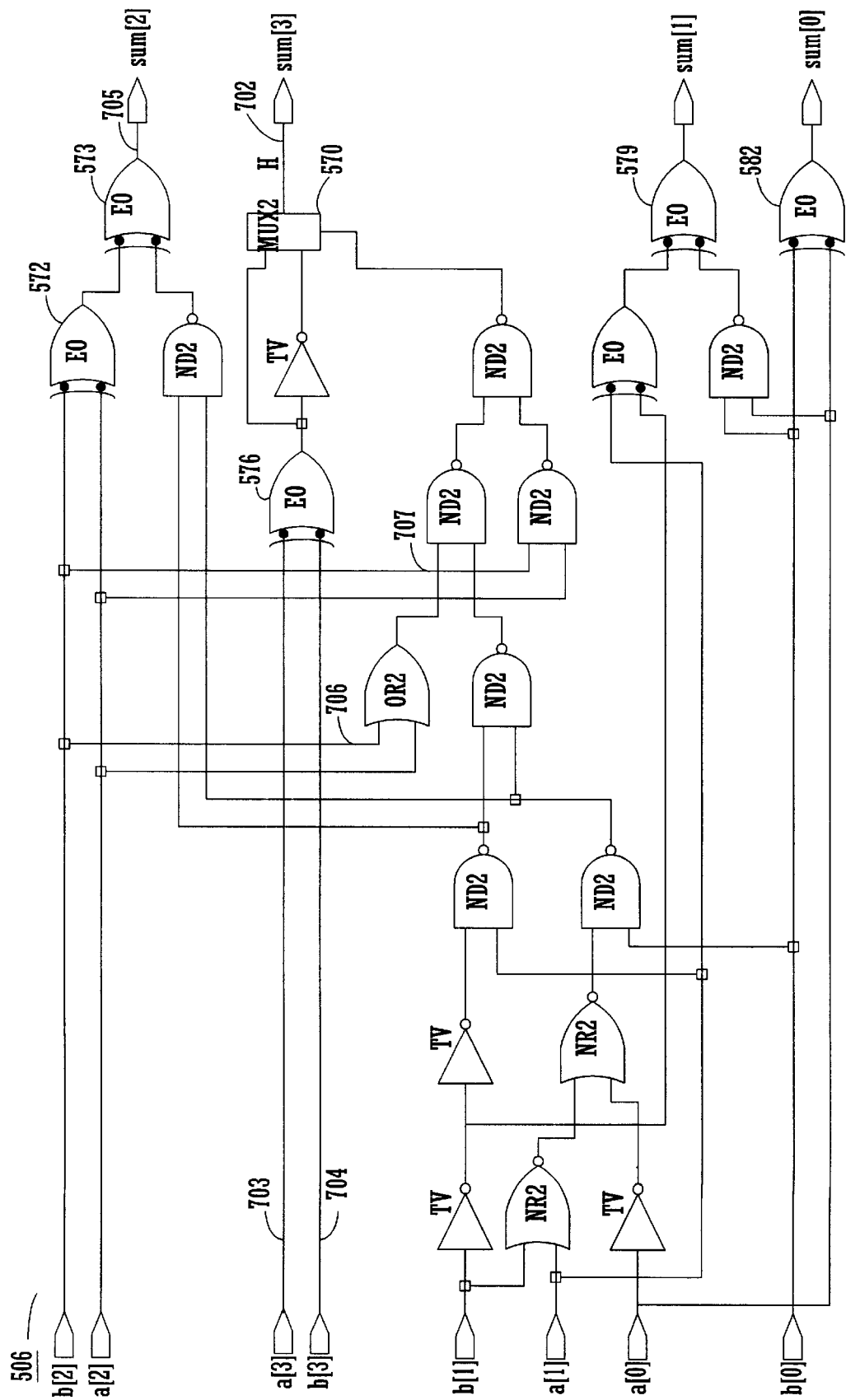
FIG. 5(d) shows a gate level view of an Adder portion of the example circuit after synthesis.

FIG. 4 shows an example circuit 400 that is to be synthesized and physically laid out. This circuit is output from synthesis software 112, or from similar software, or is entered manually. The circuit is represented in memory 104 as, for example, a netlist having a collection of cells with associated pins. The pins are connected by nets. As shown in the Figure and in step 302 of FIG. 3(a), before the circuit is synthesized, certain parts of the circuit can optionally be grouped. For example, as shown in FIG. 5(a), a multiplexor and inverter are grouped into a single block called "Muxinv"

504. This is significant because conventional gridded placement techniques do not allow blocks to be optimized together before placement, since the results of such grouping generally are not regular. Determination of which elements are to be placed in a function block can be made by the designer or by any other appropriate method. The example circuit, thus, has blocks: MUX 502, Muxinv 504, Adder 506, and Register File 508.

In the example, the blocks are connected as follows. A signal 510 is input to an In1 pin of MUX 502 and a signal 512 from Register File 508 is input to an In2 pin of Mux 502. A signal 514 on an Out pin of Mux 502 is input to an In pin of Muxinv 504. A signal 518 on an Out pin of Muxinv 504 is input to a B pin of Adder 506. An A pin of Adder 506 receives a signal 522 from an Out1 pin of Register File 508. A signal 520 on a Sum pin of Adder 506 is sent to an In pin of Register File 508. A signal 522 on an Out1 pin of Register File 508 is output to Adder 506 and is also output as a signal Out. In the example, all lines are four bits wide.

FIG. 5(*b*) shows MUX 502 of the example circuit at a gate level after synthesis, but before placement. FIG. 5(*c*) shows Muxinv 504 of the example circuit at a gate level after synthesis, but before placement. FIG. 5(*d*) shows Adder 506 of the example circuit at a gate level after synthesis, but before placement.

Figure 6:
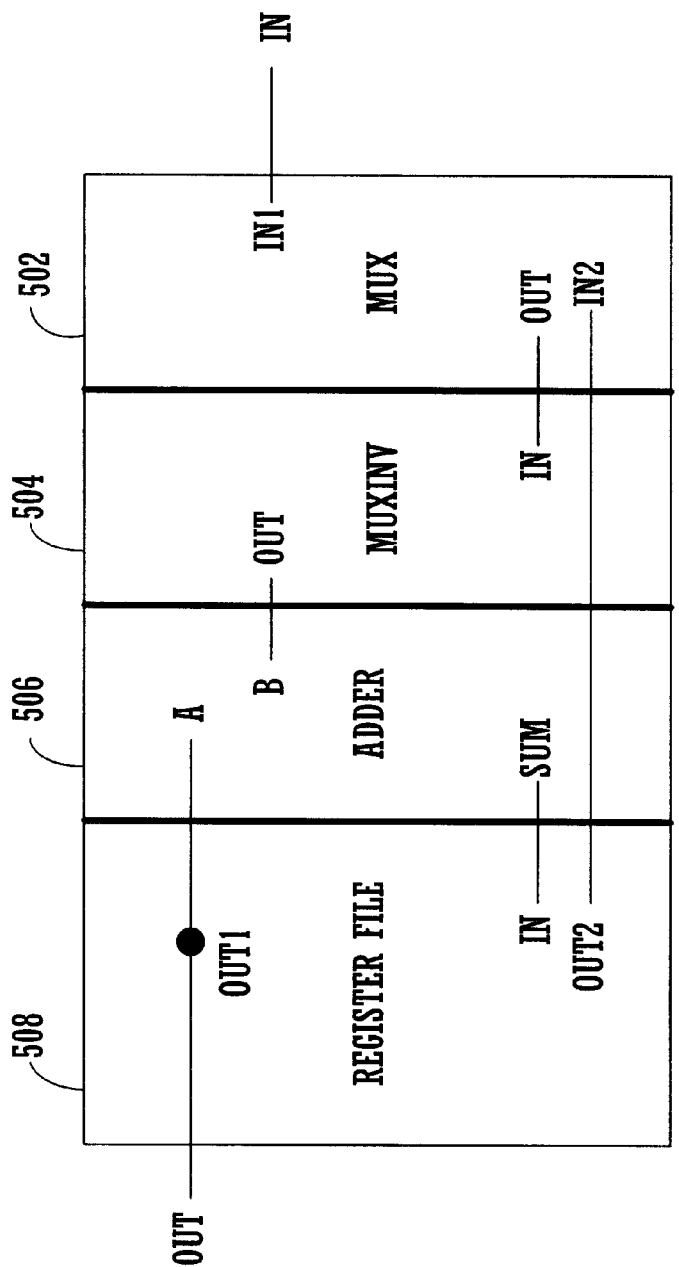
FIG. 6 shows the example circuit after an ordering step of FIG. 3(a).

It will be understood that FIGS. 6–11 represent exemplary results of steps performed by layout software 114. FIG. 6 shows the example circuit after a step 304 of FIG. 3(*a*). In step 304, the functions are ordered in a row, so that bus connections between the blocks are optimized. In the example, the blocks are arranged so that the connections run horizontally. The blocks are ordered in a way that attempts to minimize the total length of the connections. For example, the ordering could attempt to 1) shorten the wires or 2) minimize the number of wires crossing a predetermined vertical line. An example of a method to minimize wire length is K. Hall, "An n-Dimensional Quadratic Placement Algorithm," Management Science, Vol. 17, No. 3, November 1970, pp 219–229, which is herein incorporated by reference. In the example, Register File 508 is placed in a leftmost location, followed, in order by Adder 506, Muxinv 504, and Mux 502. The connections between blocks 502–508 shown in FIG. 4 is maintained.

Figure 7:
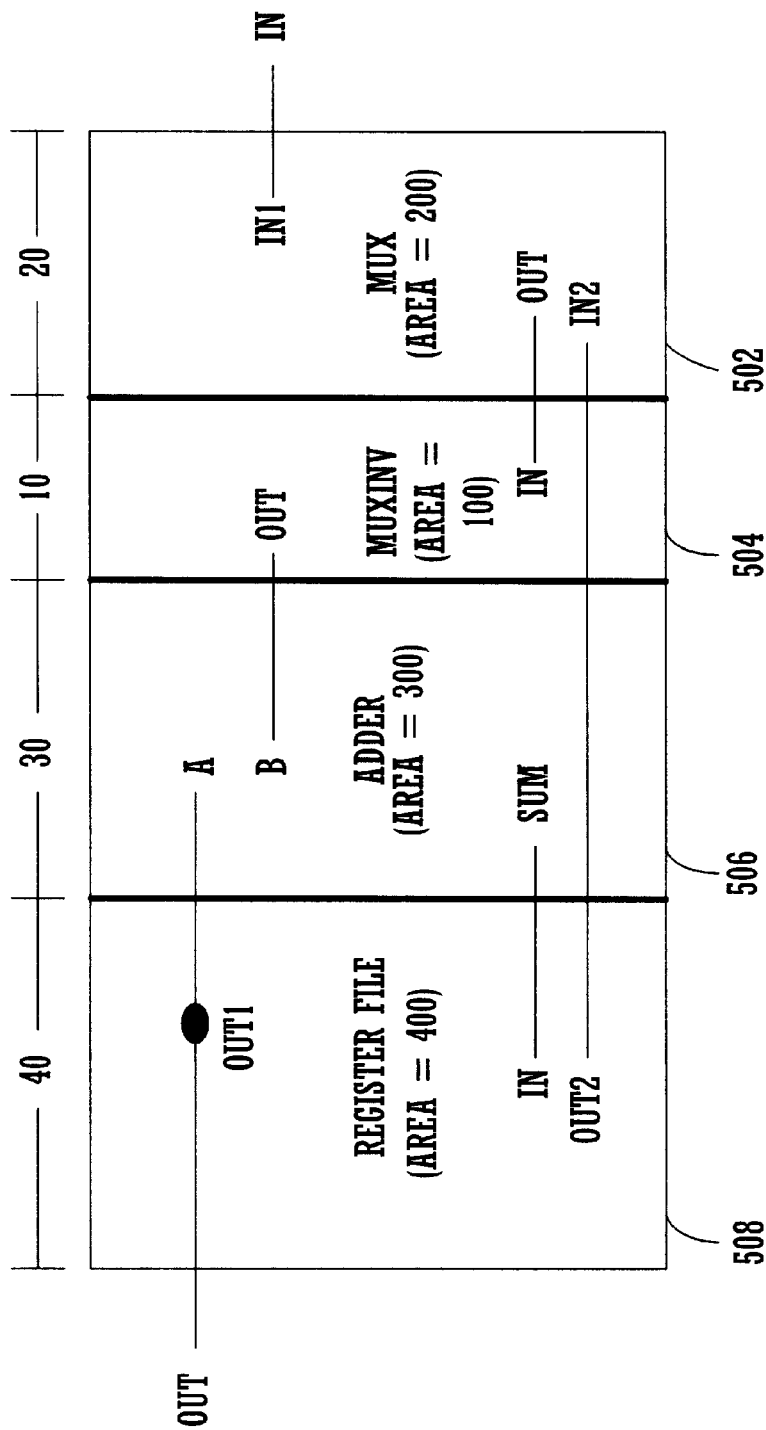
FIG. 7 shows the example circuit after finding an area of the blocks and doing a rough floorplan as shown in steps of FIG. 3.

FIG. 7 shows the example circuit after steps 306, 308 of FIG. 3(*a*). In step 306, layout software 114 defines an area of a region in which the cells are to be placed. This approximate area can be determined by running logic synthesis and, optionally, by doing trial placement. For example, the area can be obtained via Design Compiler, available from Synopsys, Inc. of Mountain View Calif. Optionally, trial placement can be done by using Cell3, available from Cadence Design Systems, Inc. of San Jose, Calif. (to further define the area) or by using Chip Architect, available from Synopsys, Inc. Note that steps 304 and 306 can be performed in the order shown or can be reversed, so that step 306 is performed before step 304.

Step 308, given the order of the functions from step 304 and the approximate area of each function from step 306, creates a rough floorplan of the entire datapath using conventional floorplanning software. Larger functions will appear proportionally larger in the floorplan. A target height or aspect ratio for the datapath will need to be supplied by a human designer or by an external automatic system. There is no restriction that the datapath be rectangular. Some functions may be taller than others, or the functions may be forced to be the same height. Once this floorplan is complete, target regions on the chip need to be filled by the logic gates of each function.

In the example of FIG. 7, the blocks of the circuit have been optimized and trial placement has been performed to obtain an area for each block. Then a datapath floorplan was determined. The height and width of each block is determined in accordance with the area of the block. In the example, the area of Register File 508 is found to be 400 Sq. units, the area of Adder 506 is found to be 300 sq. units, the area of Muxinv 504 is found to be 100 sq. units, and the area of MUX 502 is found to be 200 sq. units. The total area would be 1000 sq. units. If the target aspect ratio for the chip to be laid out has previously been determined to be 1:10, the target height would be 10 units. This implies that the widths of blocks 502–508 would be, respectively, 20, 10, 30, and 40 units.

Figure 8:
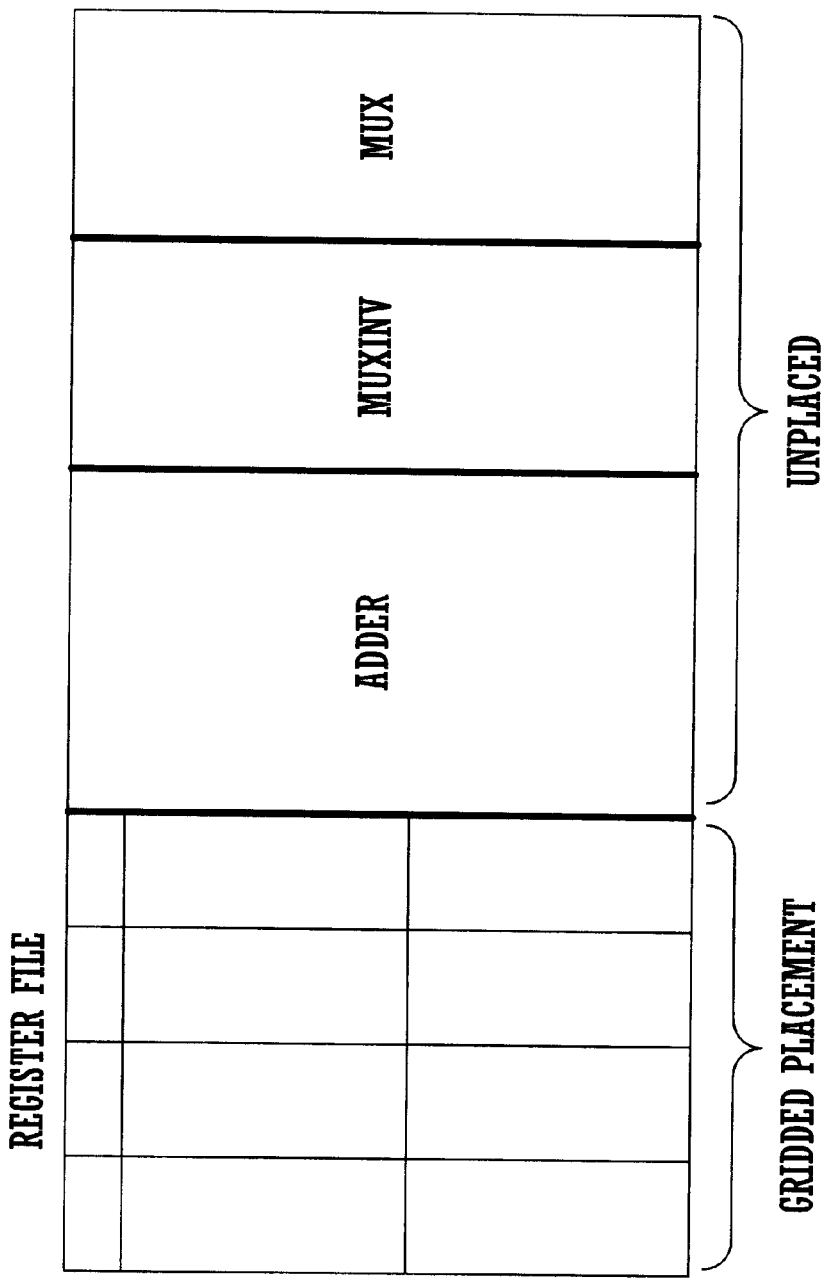
FIG. 8 shows the example circuit after a gridded placement step of FIG. 3.

Next, in steps 309–311, logic placement is performed for each function block within (or relatively near) its target region as follows:

1) As shown in step 309, if the logic gates within the block are regular (such as Register File 508), the method can optionally use gridded placement techniques. An example of a conventional gridded placement tool is SmartPath from Cadence Design Systems, Inc. of San Jose, Calif. FIG. 8 shows the example circuit after step 310 of FIG. 3(*a*). In FIG. 8, Register File block 508 has been placed using gridded placement. In the example, gates of the other blocks are not yet placed.

2) Directed placement can be performed for regular blocks (optional) and for irregular blocks. In directed placement, first the pins are spaced and then the logic gates are place as near as possible to related pins (or another chosen location). In step 310, the input and output buses of each function are distributed along the height of the block. This distribution can have even spacing as shown in FIG. 9(*a*), but this is not a requirement. In step 311, logic gates within the blocks are then placed using the directed placement method, which places the blocks "near" their input and output bus pins. An example of directed placement is described below.

FIG. 9(*a*) shows an example of how pins of the input and output busses for each block are distributed in step 310. The method in accordance with the preferred invention keeps track of which blocks are associated with which input and output pin and which input and output busses for the various blocks are connected. Thus, for example, in FIG. 9(*a*), the B3 line input to the Adder is connected to the Out3 line from the Muxinv and these pins are placed close to each other. The method also keeps track of which gates are connected to which pins. Other embodiments may order the pins differently than shown.

FIG. 9(*b*) shows an alternate view of the pin spacing step. In FIG. 9(*b*), a "virtual wire" is added to the representation in memory to indicate that EO gate 576 of the Adder block is connected to pin B3 of the Adder block. Similarly, a virtual wire is added to the representation in memory to show that EO gate 562 of the Muxinv block is connected to pin Out3 of the Muxinv block. The method will attempt to keep gates near the pins to which they are connected via virtual wires. Similar virtual wires (not shown) are added for other gates connected to I/O pins of each block.

From the floorplan, we can tell that the gates of a function should be placed at or near a particular X coordinate. From the pin information, we can tell that any logic gate which is connected to an input or output net of the function should be placed at or near a particular Y coordinate. This X and Y information allows software 114 to create objectives for the logic cell's placement. In one embodiment, this objective would be directed placement as described above. In an alternate embodiment, directed placement could be used, with the addition of absolute placement for certain gates determined by software 114 or by a human user.

As an example, if software 114 is placing a gate that is connected to pin B3, it would use a directed placement objective to place the gate at or near the X,Y coordinate of the pin.

In addition, for gates that are not connected to an input or output of the function, an alternate embodiment of software 114 could create an objective to place the gate near the X coordinate of the center of the block, while leaving the Y coordinate unconstrained. This will allow conventional placement techniques included in step 350 to choose a Y coordinate based on other objectives such as wire length.

Figure 10:
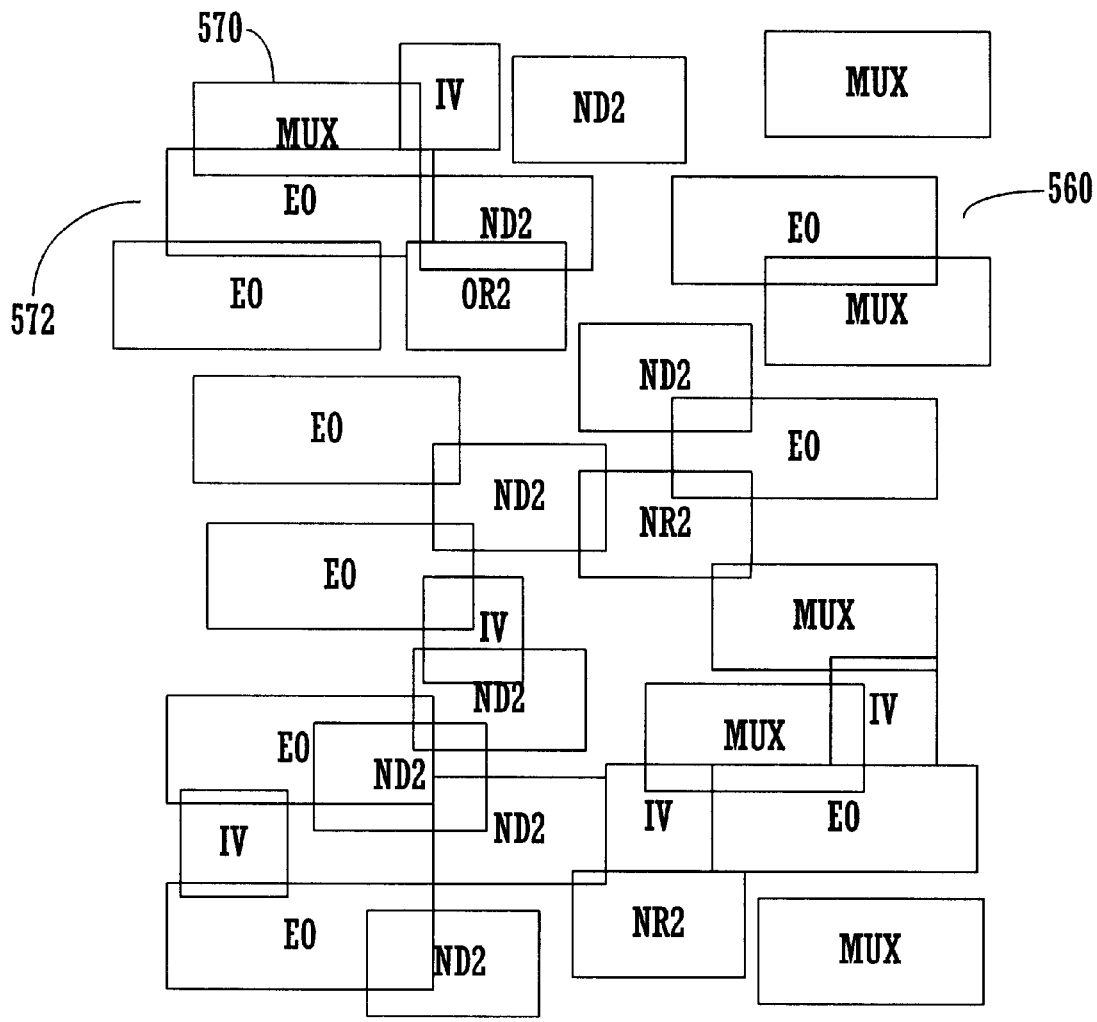
FIG. 10 shows the example circuit after a directed placement step of FIG. 3.

FIG. 10 shows an example of gates after directed placement. Note that the blocks have been placed as "near" to their input and output pins as possible. The blocks, however, overlap somewhat. Such overlap is not acceptable and is corrected in step 312. (The example in FIG. 10 is an approximation of block placement, intended only to illustrate the existence of block overlap). In practice, a larger or smaller amount of overlap may occur.

After directed placement, in step 312, the method is completed by repositioning the cells slightly to nearby "legal" locations. Such repositioning can be accomplished, for example, using Cell3 from Cadence Design Systems of San Jose, Calif.

FIG. 11 shows, for purposes of example, which gates were placed near other gates or pins. FIGS. 11(a)–11(d) show an example of repositioned cells. FIG. 11(b) shows the cells of Adder 506 in bold. FIG. 11(c) shows the cells of Muxinv 504 in bold. FIG. 11(d) shows the cells of MUX 502 in bold.

II. An example of Directed Placement

The previous paragraphs discussed a method of laying out irregular circuits that incorporates a directed placement technique. The following paragraphs give an example of how the concept of directed placement can be added to a conventional placement technique, such as quadratic placement as described in J. Kleinhans et al., "GORDIAN: VLSI Placement by Quadratic Programming and Slicing Optimization," IEEE Trans. On Computer Aided Design, Vol. 10., No. 3, March 1991, pp. 356–365, and Kleinhans et al., "GORDIAN: A New Global Optimization/Rectangle Dissection Method for Cell Placement," Proc. IEEE, Conf. On CAD, ICCAD-88, 1988, pp 506–509, each of which is herein incorporated by reference.

Quadratic placement in accordance with the present invention (i.e., for irregular logic paths) causes selected logic gates to be preferably placed near a target location on a chip. This additional objective is preferably accomplished by adding an additional objective to ensure that directed placement occurs. This additional requirement can be added to a variety of currently known placement algorithms, such as min-cut, quadratic placement, simulated annealing, etc. In one embodiment, all logic gates of all functions are placed simultaneously. This allows logic gates from different functions to "float" outside their strict boundaries and mix, if it helps improve layout quality. In another embodiment, logic gates of each function block are placed on a function-by-function bases. Non-datapath logic gates (such as those from the control logic) can also be allowed to mix with the datapath.

One embodiment of directed placement adapts the technique of quadratic placement as described in Kerihan et al. above. This technique tries to minimize the length (or sometimes the square of the length) of wires that connect two or more gates. This adaptation minimizes the distance between a gate and a particular coordinate on the chip. This could preferably be accomplished by modifying the minimum wire length technique to create a virtual (imaginary) wire from a gate to a coordinate (either an x or a y coordinate) as shown in FIG. 9(b) and reducing that virtual wire's length.

Another embodiment of directed placement adapts the technique so that a user additionally can tell the tool to place particular gates on particular regions on a chip. Another embodiment of directed placement adapts the technique that additionally forces certain logic gates to occupy an absolute position on the chip. Such a forced position is absolutely binding as to the final position of logic gates. In directed placement, the suggested position is merely a desirable goal.

In general, in directed placement, gates that are connected to particular bits of the input or output of a block should be placed as close as possible to that bit position.

FIG. 3(b) shows an example of steps performed during quadratic placement when used with additional objectives imposed by directed placement. Step 350 formulates an objective function based on the connectivity of the netlist for the circuit.

As described in Kerihan et al., the objective function is equal to the sum of the square of the distance between each pair of connected pins in the netlist, where the pins do not cross between datapath blocks. (Connections that cross between blocks are handled using a "directed placement" technique, as described below). In a preferred embodiment of the present invention, a human designer can optionally determine that certain connections are of greater importance than others. Optionally, the length of these connections is multiplied by a constant greater than one. The constant is larger for more important variables.

Step 350 also performs "directed placement" for paths that cross between blocks. Connections that cross between datapath blocks are handled separately as described below.

Cells with connections that cross between datapaths are handled using the following "directed placement" technique: For cells with connections that cross between datapath blocks, add an objective to place the cell near the connected datapath pin. This is done by adding to the objective function the square of the distance between the cell and the datapath pin. Optionally, the square may be multiplied by a constant.

Figure 9A:
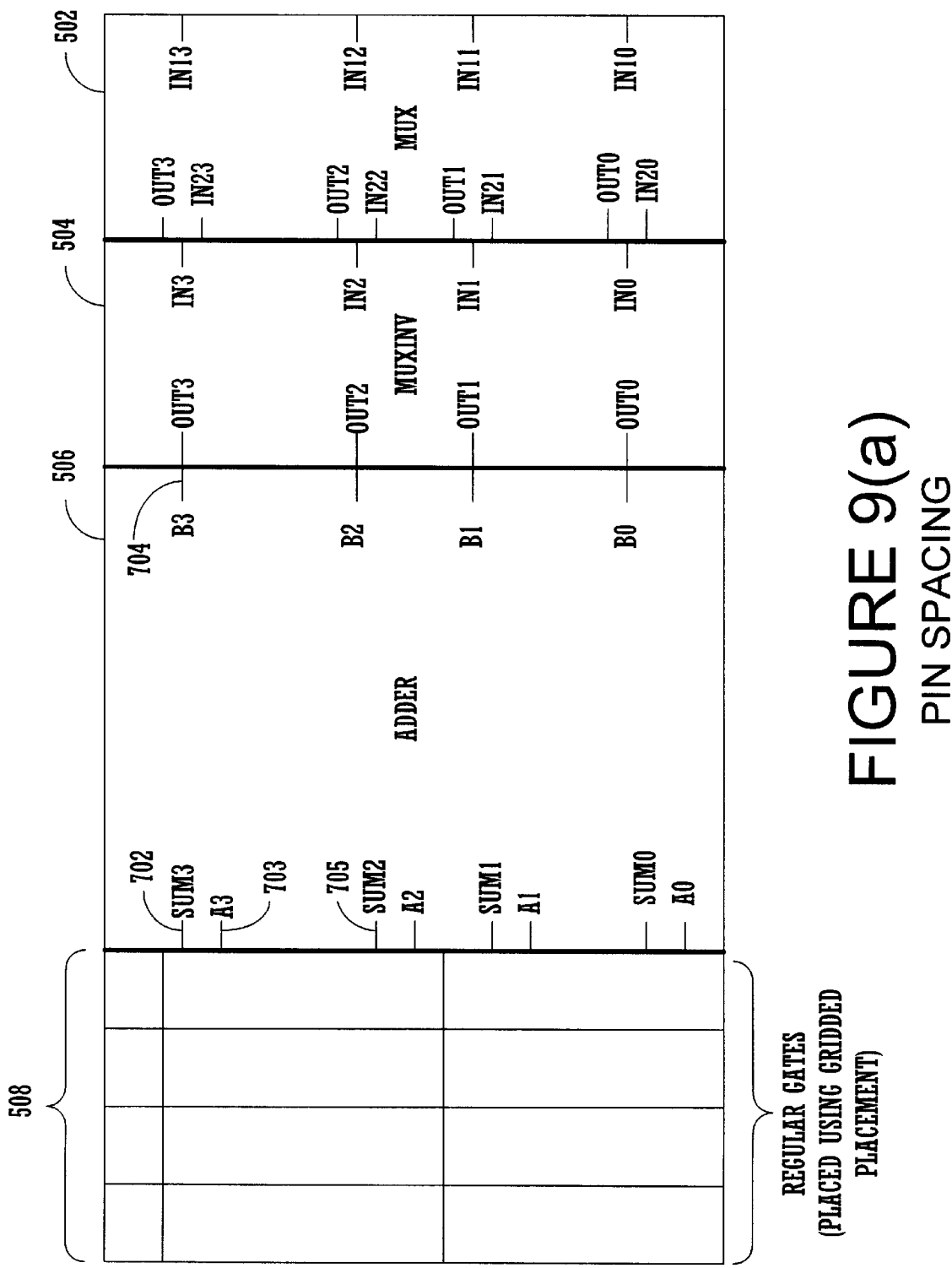
FIG. 9(a) shows the example circuit after a pin spacing step of FIG. 3.
Figure 9B:
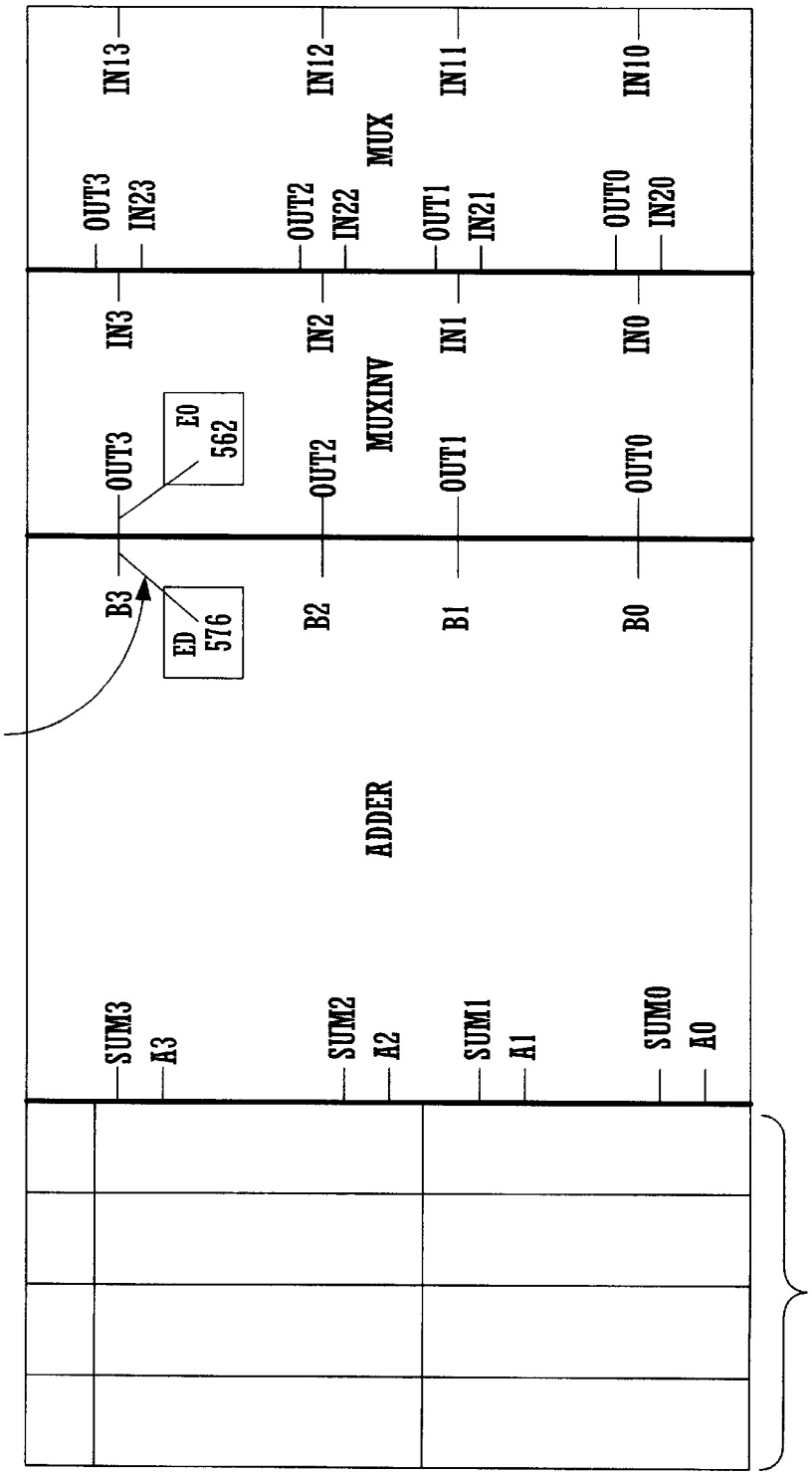
FIG. 9(b) shows an alternate view of the example pin spacing step.

FIGS. 9(a) and 9(b) show the irregular function blocks of the example circuit after step 309 of FIG. 3(a) and before directed placement. Pins have been assigned in each major block. Note that the pins have been horizontally placed along the sides of the blocks closest to where the wires connect in datapath floorplan picture of FIG. 7. Alternatively, the pins could be placed in the center of the block. Step 352 of FIG. 3(b) formulates a quadratic function that includes the virtual wires added to the circuit. These virtual wires ensure that gates will be placed as near as possible to their corresponding input and/or output pins.

In step 352, the placement tool splits the placement regions into two subregions and partitions the cells of the network into two groups, one for each subregion. Next, the placement of cells is constrained within the two groups so that their area weighted mean (center of gravity) is at the center of their respective subregions.

In step 354, the tool optimally optimizes the objective function from step 350 under the objective of step 352 to obtain an optimal cell partition (i.e., to solve the objective function). The conjugate gradient method can be used for the optimization. This method is discussed in M. R. Hestenes and E. Stiefel, "Methods of Conjugate Gradients for Solving Linear Systems," J.Res. Nat. Bur. Stand., vol. 49, vol. 6, pp 409–436,1952 and P.E. Gill et al, "Practical Optimization," London, UK: Academic 1981, each of which is herein incorporated by reference.

Thereafter, steps 350 through 354 are recursively applied on each half of the circuit until the placement regions are very small (e.g., less than 10 gates).

Figure 11A:
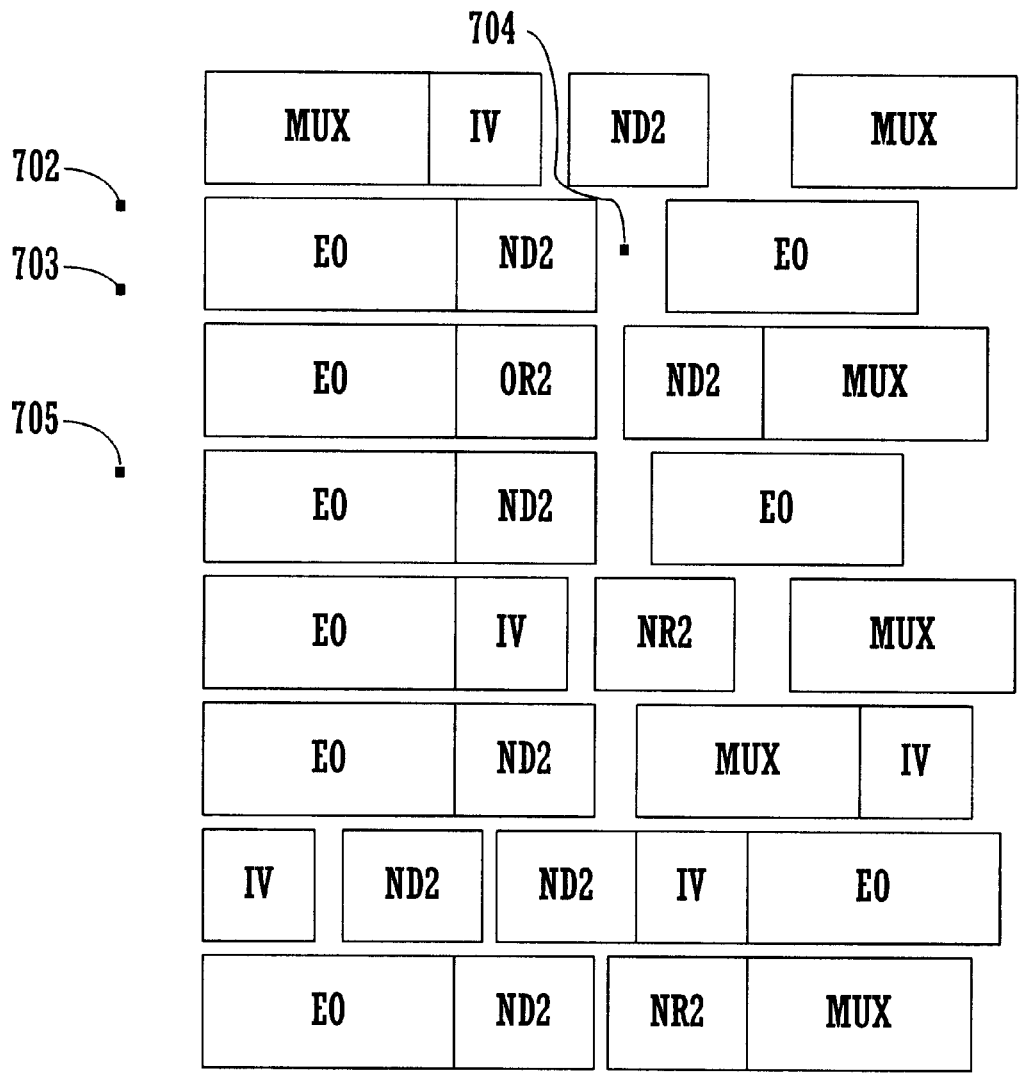
FIGS. 11(a)–11(d) show the example circuit after a cell distribution step of FIG. 3.
Figure 11B:
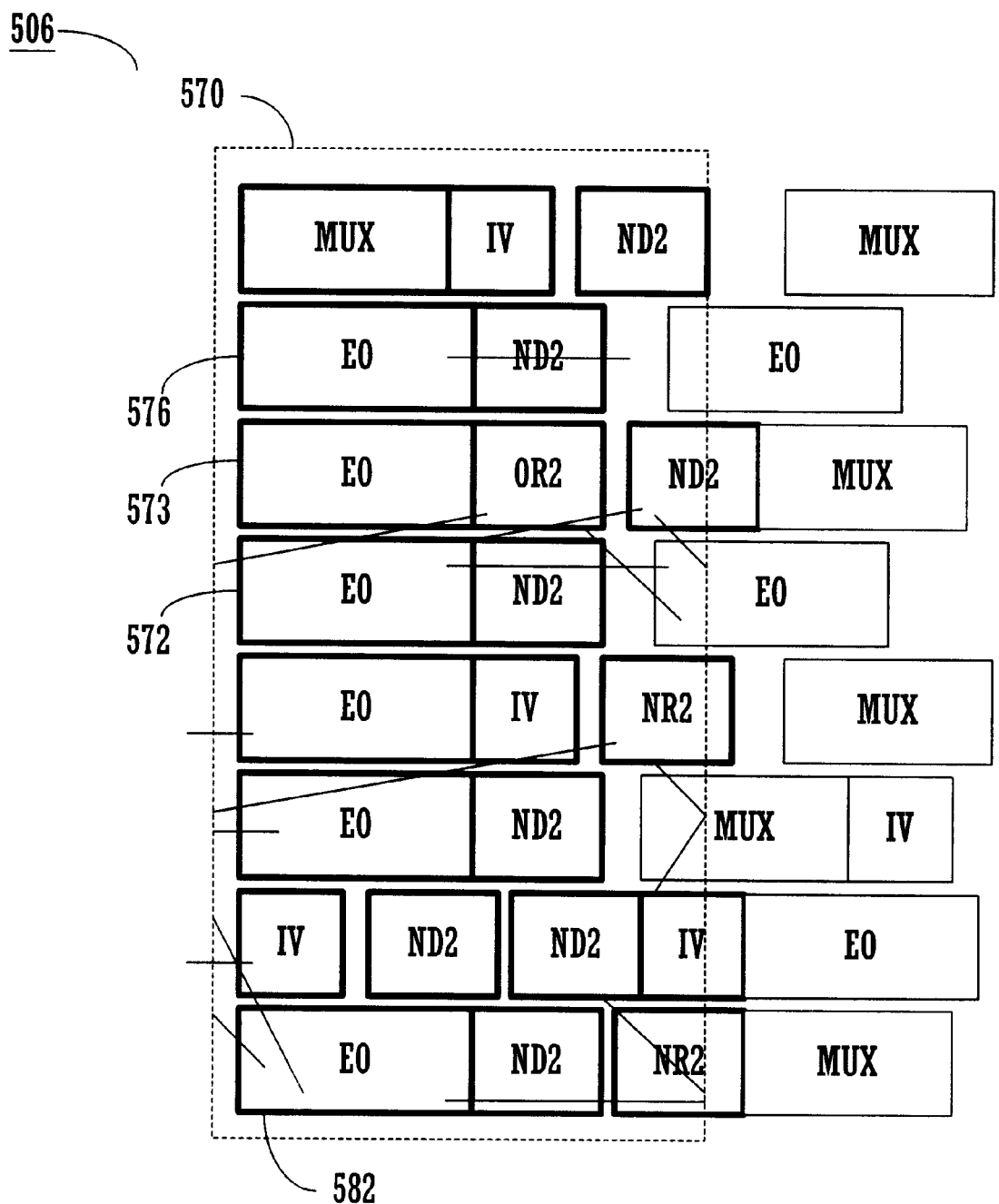

FIGS. 11(a)-11(b) show the example circuit after a step 312 of FIG. 3(a). FIG. 11(b) highlights the placement of the cells within Adder 506. The thin lines in the FIG. represent directed placement objectives to pins at the periphery of Adder 506. The original planned boundary of the adder is shown as a dotted line. Note that some cells have been allowed to float outside of the boundary of Adder 506.

Figure 11C:
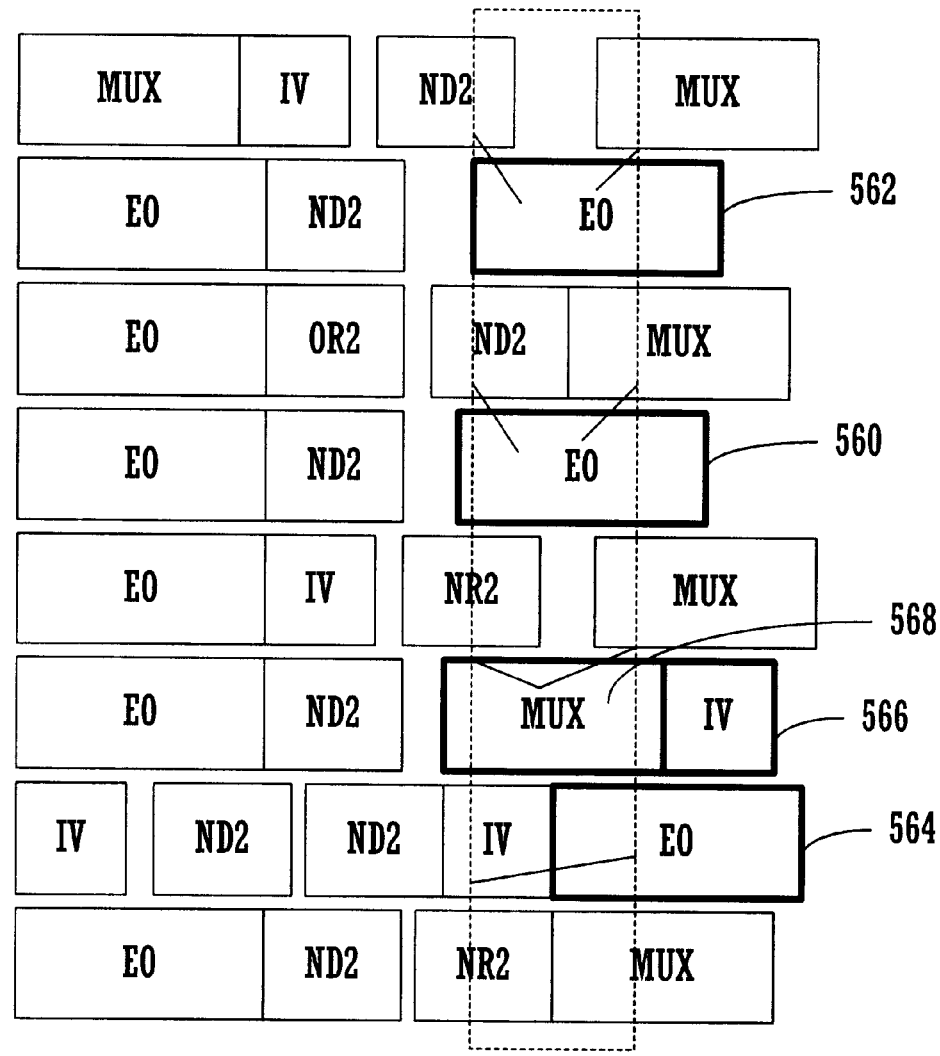
Figure 11D:
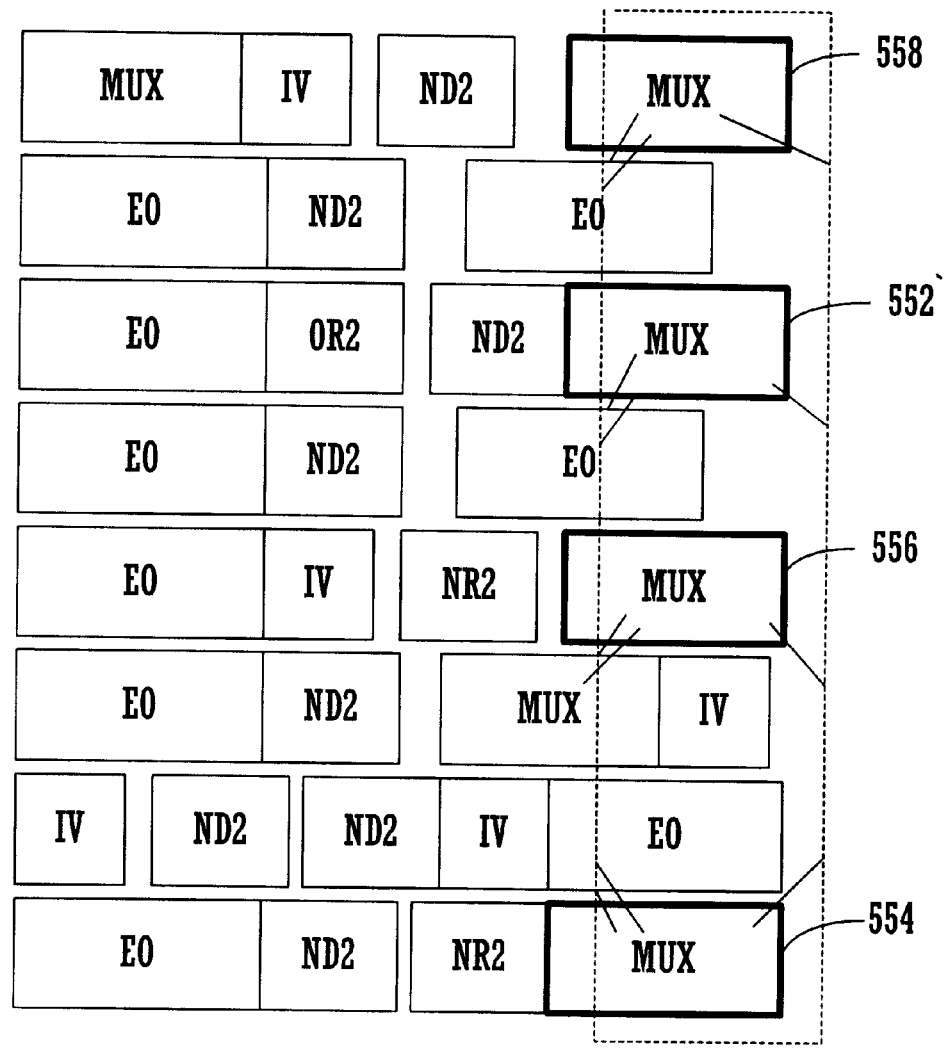

FIG. 11(c) shows the directed placement objectives for Muxinv 504. FIG. 11(d) shows the directed placement objectives for MUX 502. Again, cells of Muxinv 504 and MUX 502 have mixed with cells from other blocks.

Note that the pins are arranged as shown in FIG. 9(a). For example, pins Sum3 702 and A3 703 are topmost at the left side of the Adder block. Therefore, the cells that are on the path to or from those pins are placed as near to the pins as possible (i.e., MUX 570, which has an output to pin Sum3, and EO 576, which receives an input from pin A3). Pin B3 704 is topmost at the right side of the Adder block. Therefore, the cells that are on the path to or from pin B3 are placed as near to the pin as possible (i.e., EO 576, which receives an input from pin A3). Similarly, pins Sum2 705 and A2 are below pins Sum3 and A3 at the left side of the Adder block. Therefore, the cells that are on the path to or from those pins are placed as near to the pins as possible (i.e., EO 573, which has an output to pin Sum2, and EO 572, which receives an input from pin A2). Cells in other blocks are arranged similarly. That is, each cell connected to a pin that is an input or an output of the block is placed as near as possible to that pin.

In summary, the described embodiment of the present invention allows datapath placement to be performed for irregular logic, while still providing a way to achieve an acceptable wire length. This goal is accomplished through the use of directed placement.

Other embodiments will be apparent to those skilled in the art from consideration of the specification and practice of the invention disclosed herein. It is intended that the specification and examples be considered as exemplary only, with a true scope of the invention being indicated by the following claims and equivalents.

What is claimed is:

1. A placement method for placing elements of a circuit representation of an integrated circuit, said circuit representation stored in a memory of a computer system, said method comprising the steps of:
   a) spatially ordering each of a plurality of function blocks of a datapath of said circuit representation in order to minimize bus connections between said plurality of function blocks;
   b) determining an area for each function block of said plurality of function blocks of said datapath;
   c) determining a rough floorplan of said plurality of function blocks of said datapath based on said area for each function block and based on a spatial order determined by step a);
   d) performing gridded placement to place regular gates of said plurality of function blocks wherein each regular gate is placed at a spatial location within its associated function block;
   e) performing directed placement to place irregular gates of said plurality of function blocks and, in addition, performing directed placement to place gates having connections between datapath blocks, wherein each gate placed by step e) is placed at a location within its associated function block, said step e) comprising the steps of:
      e1) spacing input/output pins along a respective function block at approximately equal spacing; and
      e2) placing each irregular gate and each gate having connections between datapath blocks, in a location near an input/output pin that is associated with said each gate.

2. A method as described in claim 1 wherein said step e1) places said input/output pins for said respective function block at equal spatial intervals.

3. A method as described in claim 1 wherein said step e1) places said input/output pins for said respective function block at unequal spatial intervals.

4. A method as described in claim 1 wherein said step c) comprises the step of c1) determining that said plurality of function blocks are of different heights.

5. A method as described in claim 1 wherein said step c) comprises the step of c1) determining that said plurality of function blocks are of a same height.

6. A method as described in claim 1 further comprising the step of generating said circuit representation using a logic synthesis tool.

7. A method as described in claim 1 further comprising the step of grouping some of said plurality of function blocks in advance of said step a).

8. A computer usable medium having computer readable code embodied therein for causing a method of placement of an integrated circuit design having a circuit representation which is stored in a memory of a computer system, said method comprising the steps of:
   a) spatially ordering each of a plurality of function blocks of a datapath of said circuit representation in order to minimize bus connections between said plurality of function blocks;
   b) determining an area for each function block of said plurality of function blocks of said datapath;
   c) determining a rough floorplan of said plurality of function blocks of said datapath based on said area for each function block and based on a spatial order determined by step a);
   d) performing gridded placement to place regular gates of said plurality of function blocks wherein each regular gate is placed at a spatial location within its associated function block;
   e) performing directed placement to place irregular gates of said plurality of function blocks and, in addition, performing directed placement to place gates having connections between datapath blocks, wherein each gate placed by step e) is placed at a location within its associated function block, said step e) comprising the steps of:
      e1) spacing input/output pins along a respective function block at approximately equal spacing; and
      e2) placing each irregular gate and each gate having connections between datapath blocks, in a location near an input/output pin that is associated with said each gate.

9. A computer usable medium as described in claim 8 wherein said step e1) of said method places said input/output pins for said respective function block at equal spatial intervals.

10. A computer usable medium as described in claim 8 wherein said step e1) of said method places said input/output pins for said respective function block at unequal spatial intervals.

11. A computer usable medium as described in claim 8 wherein said step c) of said method comprises the step of c1) determining that said plurality of function blocks are of different heights.

12. A computer usable medium as described in claim 8 wherein said step c) of said method comprises the step of c1) determining that said plurality of function blocks are of a same height.

13. A computer usable medium as described in claim 8 wherein said method further comprises the step of generating said circuit representation using a logic synthesis tool.

14. A computer usable medium as described in claim 8 wherein said method further comprises the step of grouping some of said plurality of function blocks in advance of said step a).

* * * * *